United States Patent [19]

Kikkawa

[11] Patent Number: 4,933,305

[45] Date of Patent: Jun. 12, 1990

[54] PROCESS OF WIRE BONDING FOR SEMICONDUCTOR DEVICE

[75] Inventor: Takamaro Kikkawa, Tokyo, Japan

[73] Assignee: NEC Corporation, Tokyo, Japan

[21] Appl. No.: 224,603

[22] Filed: Jul. 27, 1988

[30] Foreign Application Priority Data

Jul. 31, 1987 [JP] Japan ................................ 62-190096

[51] Int. Cl.[5] .......................................... H01L 21/31
[52] U.S. Cl. ...................................... 437/211; 29/840;
228/175; 228/214; 357/72; 357/84; 361/400
[58] Field of Search ................. 437/211, 209; 29/840;
228/175, 214; 357/72, 84; 361/400

[56] References Cited

U.S. PATENT DOCUMENTS 4,630,095  12/1986  Otsuka et al. .......................... 357/72

FOREIGN PATENT DOCUMENTS 0209911  12/1982  Japan .
0102780   6/1985  Japan .

Primary Examiner—Brian E. Hearn
Assistant Examiner—Andrew Griffis
Attorney, Agent, or Firm—Sughrue, Mion, Zinn, Macpeak & Seas

[57] ABSTRACT

For preventing a semiconductor device from separation of a passivation film, there is disclosed a process of wire bonding comprising the steps of: (a) preparing an intermediate structure of a semiconductor device; (b) forming an inter-level insulating layer of an organic material on the intermediate structure; (c) forming at least one bonding pad on the inter-level insulating layer; (d) growing a passivation film of an inorganic material on the inter-level insulating film in a high temperature ambient, the passivation film exposing the bonding pad; and (e) connecting a bonding wire to the bonding pad at a temperature lower than that of the high temperature ambient.

15 Claims, 3 Drawing Sheets

PRIOR-ART

PROCESS OF WIRE BONDING FOR SEMICONDUCTOR DEVICE

FIELD OF THE INVENTION

This invention relates to a process of fabricating a semiconductor device and, more particularly, to a thermocompression bonding process for fabricating a semiconductor device.

BACKGROUND OF THE INVENTION

In general, packaging can significantly affect, if not dominate, the reliability of the packaged integrated circuit. In detail, an integrated device is usually fabricated on a semiconductor substrate and covered with a passivation film structure for preventing the integrated circuit from damages caused by, for example, water and impurities. A typical example of the passivation film structure is shown in FIG. 1 of the drawings. The passivation film structure comprises a phosphosilicate glass film 1 covering a silicon substrate 2 where the integrated circuit is formed, an organic insulating film 3 of polyimide and a waterproof film 4 of a silicon nitride. Though not shown in the drawings, the integrated circuit is accompanied by a plurality of bonding pads of aluminum, and a bonding wire of aurum is connected to each of the bonding pads for providing an interconnection between the integrated circuit and a leadframe. The wire bonding technique is well known as a nail head thermocompression wire bonding process in which the bonding wire is bonded to the bonding pad under thermocompression at a temperature ranging between 350 degrees and 375 degrees in centigrade. The reason why the bonding operation is carried out at the high temperature is to prevent the bonding wire from separation and, accordingly, to enhance the production yield of the semiconductor device.

However, a problem is encountered in the prior-art thermocompression process in that the waterproof film 4 tends to separate from the organic insulating film 3, which degrades the reliability of the semiconductor device. This is because of the fact that low temperature processes lower than 320 degrees in centigrade are applied to the structure in later fabrication stages but the wire bonding process is carried out at the higher temperature. This higher temperature results in that a gaseous mixture mainly composed of water is diffused from the organic insulating film 3 and, accordingly, lifts up the waterproof film 4 to produce a closed space 5 as illustrated in FIG. 1.

SUMMARY OF THE INVENTION

It is therefore an important object of the present invention to provide a process of wire bonding which does not degrade the reliability of the semiconductor device.

It is also an important object of the present invention to provide a process of wire bonding which is free from the outdiffusion gaseous mixture.

To accomplish these objects, the present invention proposes to carry out a wire bonding at a temperature lower than that for the latest fabrication stage.

In accordance with one aspect of the present invention, there is provided a process of wire bonding comprising the steps of: (a) preparing an intermediate structure of a semiconductor device; (b) forming an inter-level insulating layer of an organic material on the intermediate structure; (c) forming at least one bonding pad on the inter-level insulating layer; (d) growing a passivation film of an inorganic material on the inter-level insulating film in a high temperature ambient, the passivation film exposing the bonding pad; and (e) connecting a bonding wire to the bonding pad at a temperature lower than that of the high temperature ambient.

In accordance with another aspect of the present invention, there is provided a process of wire bonding comprising the steps of: (a) preparing an intermediate structure of a semiconductor device having a surface on which a bonding pad is formed; (b) forming a first insulating film of an organic material covering the surface of the intermediate structure except for the bonding pad; (c) growing a second insulating film of an inorganic material in a high temperature ambient, the second insulating film covering the first insulating film and exposing the bonding pad; and (d) connecting a bonding wire to the bonding pad at a temperature lower than that of the high temperature ambient.

BRIEF DESCRIPTION OF THE DRAWINGS

The features and advantages of a process of wire bonding according to the present invention will be more clearly understood from the following description taken in conjunction with the accompanying drawings in which.

DESCRIPTION OF THE PREFERRED EMBODIMENTS

First Embodiment

Figure 1:
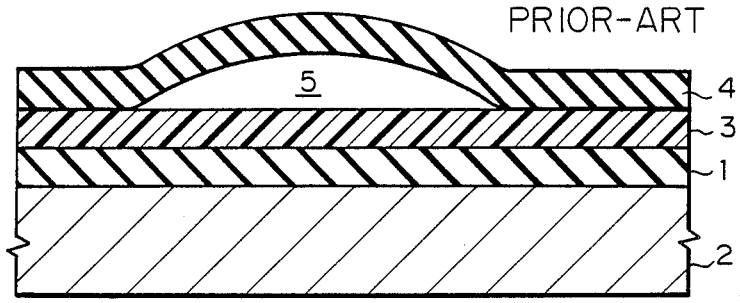
FIG. 1 is a cross sectional view showing the structure of a prior-art semiconductor device.
Figure 2A:
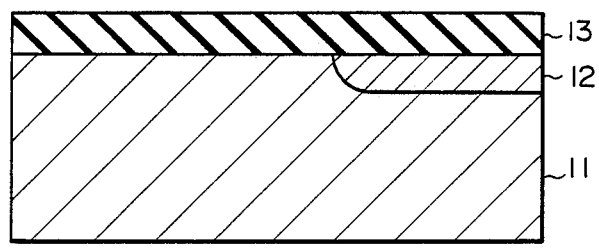
FIGS. 2A to 2F are cross sectional views showing a process sequence embodying the present invention.

Referring to FIGS. 2A to 2F, description is made for a process sequence embodying the present invention. The process starts with a (100) oriented lightly doped p-type monocrystalline silicon substrate 11, and an integrated circuit is fabricated on the silicon substrate 11. In the silicon substrate 11 are doped impurity atoms which are used for formation of various impurity regions for component elements of the integrated circuit, and FIG. 2A shows one of an n-type impurity region 12 for a signal propagation path. On the silicon substrate 11 is deposited a phosphosilicate glass film 13 to a thickness of about 1 micron by using a chemical vapor deposition technique, and the phosphosilicate glass film 13 contains about 4 mol % of phosphorus atoms. The resultant structure of this stage is illustrated in FIG. 2A.

Figure 2B:
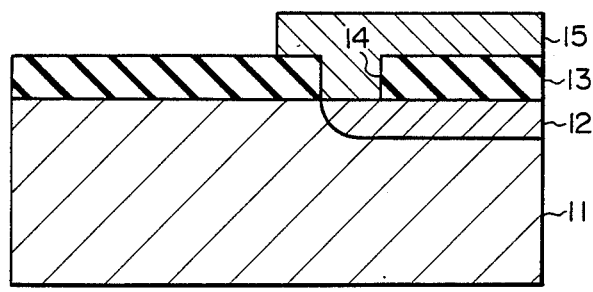

Subsequently, contact windows including a contact window 14 are formed in the phosphosilicate glass film 13 by using appropriate lithographic techniques, and an aluminum film is deposited on the entire surface of the structure to a thickness of about 1 micron by using a dc sputtering system. The structure is provided with the plural contact windows, however description is hereinunder focused upon the contact window 14 only. The aluminum film is patterned to form an interconnection 15 of a first level which is in contact with the n-type impurity region 12 through the contact window 14. The resultant structure of this stage is illustrated in FIG. 2B.

An organic solution is spun on the entire surface of the structure at a rotational speed of about 4000 revolutions per minute for about 30 seconds to form an organic film. The organic solution is prepared by mixing and reacting a tetracarboxyl dianhydride represented by the following general formula (1) of

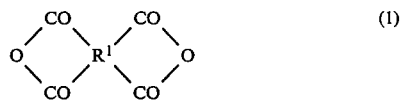

where $R^1$ is a tetravalent carbocyclic aromatic group, a diamine represented by the following general formula (2) of $$NH_2-R^2-NH_2 \qquad (2)$$

where $R^2$ is an aromatic aliphatic group or a carbocyclic aromatic group each having 6 to 30 carbon atoms, and an aminosiloxane represented by the following general formula (3) of

Figure 2C:
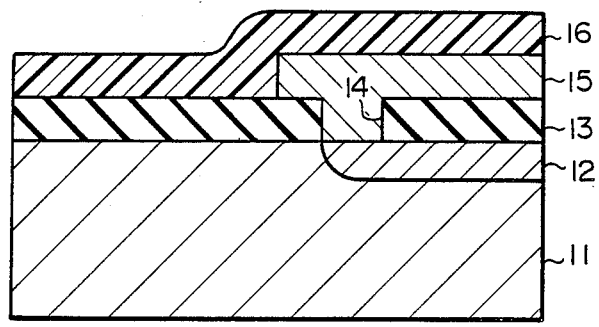

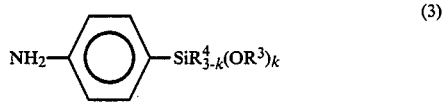

where $R^3$ and $R^4$ are, independently, an alkyl group or phenyl group each having 1 to 6 carbon atoms and k is equal to or greater than 1 but equal to or less than 3. The organic film is placed in a nitrogen ambient of about 100 degrees in centigrade for about 1 hour and, then, of about 240 degrees in centigrade for about 30 minutes, thereby carrying out a pre-baking. The organic film is then placed in a nitrogen ambient of 400 degrees in centigrade for about 1 hour for post baking, then an interlevel insulating layer 16 of about 1 micron thick is formed on the interconnection 15 as illustrated in FIG. 2C.

Figure 2D:
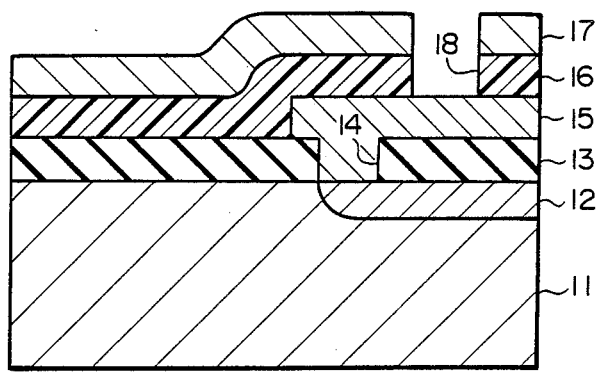

On the inter-level insulating layer 16 is deposited a titanium film which is patterned to form a mask layer 17. With the mask layer 17, the inter-level insulating layer 16 is partially removed by using an etching gaseous mixture composed of carbon tetrafluoride ($CF_4$) and oxygen ($O_2$) to form a contact window 18 which penetrates on the upper surface of the interconnection 15 as illustrated in FIG. 2D. After formation of the contact window 18, the mask layer 17 is stripped off.

Figure 2E:
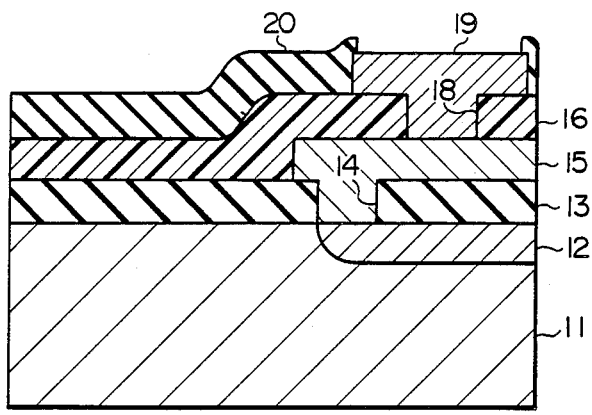

After formation of the contact window 18, aluminum is deposited on the entire surface of the structure to a thickness of about 1 micron and, then, partially removed to form a second level interconnection and a bonding pad 19. The structure is placed in a reactor (not shown) for heating up to a temperature of about 320 degrees in centigrade. The temperature is kept for about an hour, so that undesirable contents mainly composed of water are evaporated. After this heat treatment, a gaseous mixture containing silane ($SiH_4$) and ammonia is supplied to the reactor for a plasma-assisted chemical vapor deposition. The gas flow rates are 180 sccm for silane and 1080 sccm for ammonia, respectively, and a reacting ambient is at about 320 degrees in centigrade. Then, a silicon nitride is deposited on the entire surface of the structure to a thickness of about 1.0 micron. The silicon nitride film is patterned to form a waterproof passivation film 20 exposing the bonding pad 19 as illustrated in FIG. 2E.

Figure 2F:
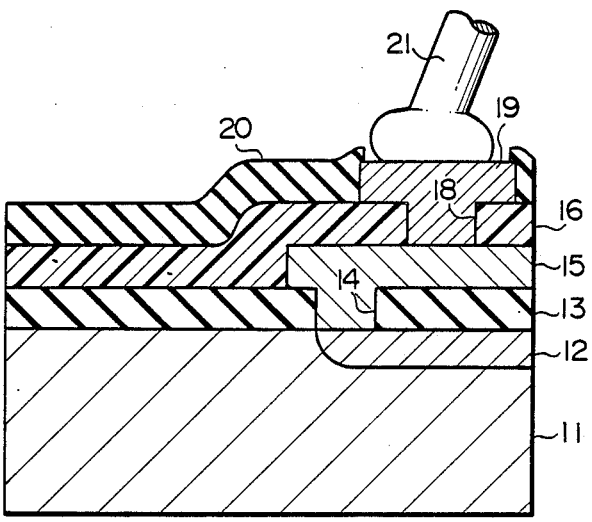

The passivation film structure is thus formed, then a gold wire 21 is bonded to the bonding pad 19 to provide an electrical connection between the integrated circuit and a leadframe (not shown). The gold wire 21 is about 35 microns in diameter, and the bonding operation is carried out by using a nail head thermocompression bonding system in which the gold wire is heated up to a temperature of about 200 degrees in centigrade and applied with an ultrasonic of about 66 KHz with a power of 0.6 W for 5 to 15 milli-seconds. The resultant structure is illustrated in FIG. 2F.

Thus, the gold wire is heated up to a temperature lower than the deposition temperature of about 320 degrees in centigrade, so that no separation takes place between the inter-level insulating layer 16 and the waterproof passivation film 20.

In one modification of the first embodiment, a silicon oxynitride film is deposited on inter-level insulating layer 16 as a waterproof passivation film. The deposition is carried out in a low pressure ambient of about 2 Torr at a high temperature of about 320 degrees in centigrade and, gas flow rates are 180 sccm for silane, 972 sccm for ammonia and 108 sccm for nitrogen oxide. Then, the silicon oxynitride film is grown to a thickness of about 1 micron, and the silicon oxynitride film is patterned to expose the bonding pad 19. A gold wire is bonded to the bonding pad 19 in thermocompression of about 309 degrees in centigrade, and the gold wire is 35 microns in diameter.

Second Embodiment

Figure 3:
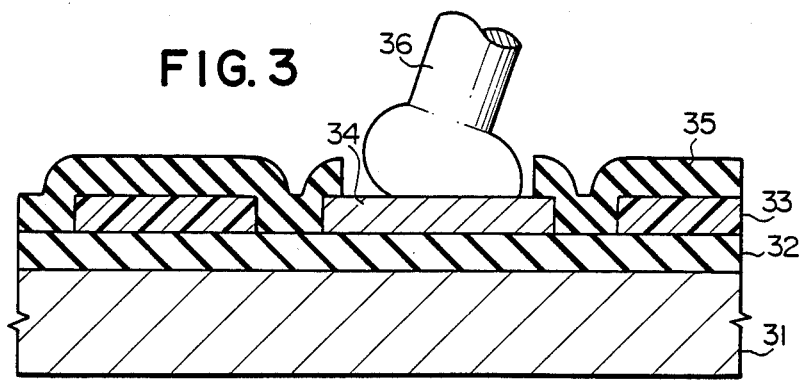
FIG. 3 is a cross sectional view showing the resultant structure of a semiconductor device formed by using another process sequence embodying the present invention.

Turning to FIG. 3 of the drawings, there is shown the structure of a semiconductor device formed by another process sequence embodying the present invention. An integrated circuit is fabricated on a silicon substrate 31 which is covered with a phosphosilicate glass film 32. On the phosphosilicate glass film 32 is spun polyimide to form an organic insulating layer 33 which is patterned by using an appropriate etching technique. Aluminum film is deposited on the entire surface of the structure, and the aluminum film is etched and patterned to form a bonding pad 34. In this instance, the bonding pad 34 is coplanar with the organic insulating layer 33, and a passivation film 35 of a silicon nitride is deposited on the organic insulating film 33 by using a chemical vapor deposition technique. A gold wire 36 is bonded to the bonding pad 34 under thermocompression, however the gold wire 36 is not heated up to a temperature higher than the temperature created in the deposition reactor.

Although particular embodiment of the present invention have been shown and described, it will be obvious to those skilled in the art that various changes and modifications may be made without departing from the spirit and scope of the present invention.

What is claimed is:

1. A process of wire bonding comprising the steps of:
    (a) preparing an intermediate structure of a semiconductor device;
    (b) forming an inter-level insulating layer of an organic material on said intermediate structure;
    (c) forming at least one bonding pad on said inter-level insulating layer;
    (d) forming a passivation film of an inorganic material on said inter-level insulating film at a first temperature;
    (e) selectively removing a part of said passivation film so as to expose said bonding pad; and (f) directly connecting a bonding wire to said bonding pad at a second temperature lower than said first temperature ambient under an application of an ultrasonic vibration, in which said inter-level insulating layer is formed by the sub-steps of coating the intermediate structure with an organic solution, giving a pre-baking to said organic solution, and giving a post baking to form said inter-level insulating layer having a thickness of about 1 micron.

2. A process of wire bonding as set forth in claim 1, in which said organic solution is prepared by mixing and reacting a tetracarboxyl dianhydride represented by the following general formula (1) of

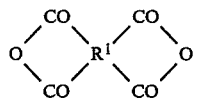   (1)

where $R^1$ is a tetravalent carbocyclic aromatic group, a diamine represented by the following general formula (2) of

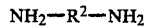   (2)

$$NH_2-R^2-NH_2$$

where $R^2$ is an aromatic aliphatic group or a carbocyclic aromatic group each having 6 to 30 carbon atoms, and an aminosiloxane represented by the following general formula (3) of

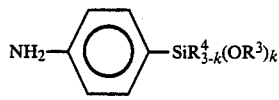   (3)

where $R^3$ and $R^4$ are, independently, an alkyl group or phenyl group each having 1 to 6 carbon atoms and k is equal to or greater than 1 but equal to or less than 3.

3. A process of wire bonding as set forth in claim 2, in which said organic solution is spun onto said intermediate structure at rotational speed of about 4000 revolutions per minute for 30 minutes.

4. A process of wire bonding as set forth in claim 3, in which said pre-baking comprises first and second stages, said first stage being carried out in a nitrogen ambient at a temperature of about 100 degrees in centigrade for about an hour, said second stage being carried out in a nitrogen ambient at a temperature of about 240 degrees in centigrade for about 30 minutes.

5. A process of wire bonding as set forth in claim 4, in which said post baking is carried out in a nitrogen ambient at a temperature of about 400 degrees in centigrade for about an hour.

6. A process of wire bonding comprising the steps of:
(a) preparing an intermediate structure of a semiconductor device having a surface on which a bonding pad is formed;
(b) forming a first insulating film of an organic material covering the surface of said intermediate structure except for said bonding pad;
(c) carrying out a heat application for evaporating water contained in said first insulating film of the organic material;
(d) forming a second insulating film of an inorganic material at a first temperature, said second insulating film covering said first insulting film substantially without said water except for said bonding pad;
(e) directly connecting a bonding wire to said bonding pad at a second temperature lower than said first temperature under an application of an ultrasonic vibration.

7. A process of wire bonding comprising the steps of:
(a) preparing an intermediate structure of a semiconductor device;
(b) forming an inter-level insulating layer of an organic material on said intermediate structure;
(c) forming at least one bonding pad on said inter-level insulating layer;
(d) forming a passivation film of an inorganic material on said inter-level insulating film at a first temperature;
(e) selectively removing a part of said passivation film so as to expose said bonding pad; and
(f) directly connecting a bonding wire to said bonding pad at a second temperature lower than said first temperature under an application of an ultrasonic vibration, in which said passivation film is formed by a plasma-assisted chemical vapor deposition technique using a gaseous mixture containing silane and ammonia.

8. A process of wire bonding as set forth in claim 7, in which gas flow rates are 180 sccm for said silane and 1080 sccm for said ammonia, respectively.

9. A process of wire bonding as set forth in claim 8, in which said silane and said ammonia are reacted at a temperature of about 320 degrees in centigrade.

10. A process of wire bonding as set forth in claim 9, in which said bonding wire is bonded to said bonding pad at a temperature about 200 degrees in centigrade.

11. A process of wire bonding as set forth in claim 10, in which an ultrasonic of about 66 KHz is applied to said bonding wire for a time duration ranging between 5 milli-seconds and 15 milliseconds.

12. A process of wire bonding comprising the steps of:
(a) preparing an intermediate structure of a semiconductor device;
(b) forming an inter-level insulating layer of an organic material on said intermediate structure;
(c) forming at least one bonding pad on said inter-level insulating layer;
(d) forming a passivation film of an inorganic material on said inter-level insulating film at a first temperature;
(e) selectively removing a part of said passivation film so as to expose said bonding pad; and
(f) directly connecting a bonding wire to said bonding pad at a second temperature lower than said first temperature under an application of an ultrasonic vibration, in which said passivation film is formed by a plasma-assisted chemical vapor deposition technique using a gaseous mixture containing silane, ammonia and nitrogen oxide, and in which gas flow rates are 180 sccm for said silane and 972 sccm for said ammonia and 108 for said nitrogen oxide, respectively.

13. A process of wire bonding as set forth in claim 12, in which said silane, said ammonia and said nitrogen oxide are reacted in a low pressure ambient of about 2 Torr at a temperature of about 320 degrees in centigrade.

14. A process of wire bonding as set forth in claim 13, in which said bonding wire is bonded to said bonding pad at a temperature of about 309 degrees in centigrade.

15. A process of fabricating a semiconductor device comprising the steps of:
   (a) preparing an intermediate structure of a semiconductor device;
   (b) forming an inter-level insulating layer of an organic material on said intermediate structure;
   (c) forming at least one bonding pad on said inter-level insulating layer;
   (d) carrying out a heat treatment for evaporating water contained in said inter-level insulating layer;
   (e) forming a passivation film on said inter-level insulating layer substantially without said water at a first temperature;
   (f) selectively removing a part of said passivation film so as to expose said bonding pad; and
   (g) directly connecting a bonding wire to said bonding pad at a second temperature lower than said first temperature under an application of an ultrasonic vibration.

* * * * *